(12) United States Patent
Partee

(10) Patent No.: US 9,091,706 B2
(45) Date of Patent: Jul. 28, 2015

(54) SYSTEM AND METHOD FOR A REMOTE CONTROL TESTER

(71) Applicant: ATC Logistics & Electronics, Inc., Fort Worth, TX (US)

(72) Inventor: Jimmie Paul Partee, Double Oak, TX (US)

(73) Assignee: ATC Logistics & Electronics, Inc., Fort Worth, TX (US)

( * ) Notice: Subject to any disclaimer, the term of this patent is extended or adjusted under 35 U.S.C. 154(b) by 306 days.

(21) Appl. No.: 13/741,850

(22) Filed: Jan. 15, 2013

(65) Prior Publication Data

US 2014/0197857 A1    Jul. 17, 2014

(51) Int. Cl.
*H04B 17/00* (2006.01)
*G01R 1/02* (2006.01)
*G01R 1/04* (2006.01)

(52) U.S. Cl.
CPC ............. *G01R 1/02* (2013.01); *G01R 1/0408* (2013.01)

(58) Field of Classification Search
CPC ....... H04L 43/045; H04L 43/50; H04B 17/00
USPC ....................................... 324/750.15, 750.18
See application file for complete search history.

(56) References Cited

U.S. PATENT DOCUMENTS

2007/0075719 A1*    4/2007    Chung et al. ................. 324/765

\* cited by examiner

*Primary Examiner* — Vincent Q Nguyen
(74) *Attorney, Agent, or Firm* — McGuireWoods LLP

(57) ABSTRACT

A system and method for testing remote controls. A number of remote controls are identified. The remote controls are received on a tray of a remote control tester. The tray is positioned for testing. The number of remote controls are tested within the tray utilizing the remote control tester in response to identifying the number of remote controls.

5 Claims, 12 Drawing Sheets

US 9,091,706 B2

SYSTEM AND METHOD FOR A REMOTE CONTROL TESTER

BACKGROUND

The use of and development of electronics equipment has grown nearly exponentially in recent years. The growth is fueled by better electronics hardware and software available to organizations and consumers and the increased appetite for mobile devices. In particular, electronic devices, such as televisions, set-top boxes, residential gateways, streaming devices, media players, medical equipment, gaming devices, and other similar electronic devices are being released nearly constantly. Many electronic devices are configured to communicate with or be controlled by a remote control. Remote controls typically control such machines, devices, or apparatuses utilizing wireless radio frequency signals.

Millions of electronic devices and their respective remote controls are returned, refurbished, fixed, or otherwise processed each year. Testing remote controls may be difficult because of the number of devices to be processed, varying wireless signals or frequencies, power requirements, layouts and configurations, and other functional and non-functional characteristics. As a result, in many cases re-processed remote controls are not tested to determine functionality or are discarded increasing costs, user frustration, and environmental and manufacturing waste.

SUMMARY

One embodiment includes a system and method for testing remote controls. A number of remote controls may be identified. The remote controls may be received on a tray of a remote control tester. The tray may be positioned for testing. The number of remote controls may be tested within the tray utilizing the remote control tester in response to identifying the number of remote controls.

Another embodiment includes a remote control tester. The remote control tester may include a frame configured to support components of the remote control tester. The remote control tester may also include one or more trays configured to secure a number of remote controls for testing. The one or more trays may include a power interface for powering each of the plurality of remote controls during testing. The remote control tester may further include one or more motors configured to move a set of actuators including a set of plungers. The set of plungers may be utilized to press corresponding buttons of a set of the number of remote controls simultaneously. The remote control tester may further include a controller for controlling the one or more motors and the set of actuators in response to a test program associated with the number of remote controls. The remote control tester may further include a user interface connected to the controller for receiving user input. The remote control tester may further include one or more transceivers connected to the controller for receiving wireless signals from the number of remote controls during testing. The remote control tester may further include a display for displaying testing information for the plurality of remote controls to a user.

Yet another embodiment provides a remote control tester. The remote control tester may include a processor for executing a set of instructions and one or more memories for storing the set of instructions. The set of instructions may be executed by the processor to identify a number of remote controls utilizing an identifier, power the number of remote controls in response to receiving the remote controls in a tray of the remote control tester, and test the number of remote controls within the tray utilizing a testing program associated with the identifier.

BRIEF DESCRIPTION OF THE DRAWINGS

Illustrative embodiments of the present invention are described in detail below with reference to the attached drawing figures, which are incorporated by reference herein and wherein.

DETAILED DESCRIPTION OF THE DRAWINGS

Figure 1:
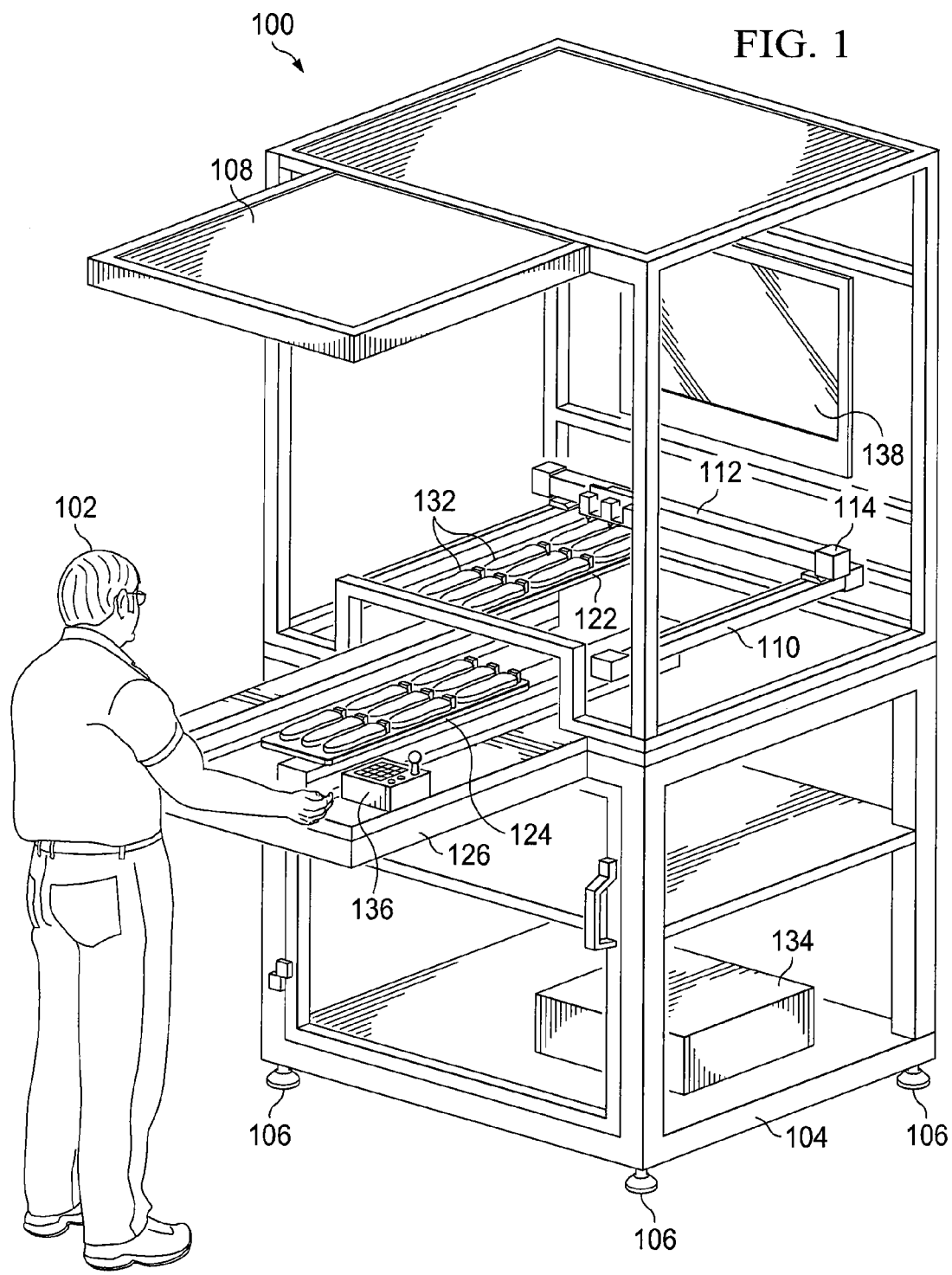
FIG. 1 is a pictorial representation of a remote control tester being utilized by a user in accordance with an illustrative embodiment.
Figure 2:
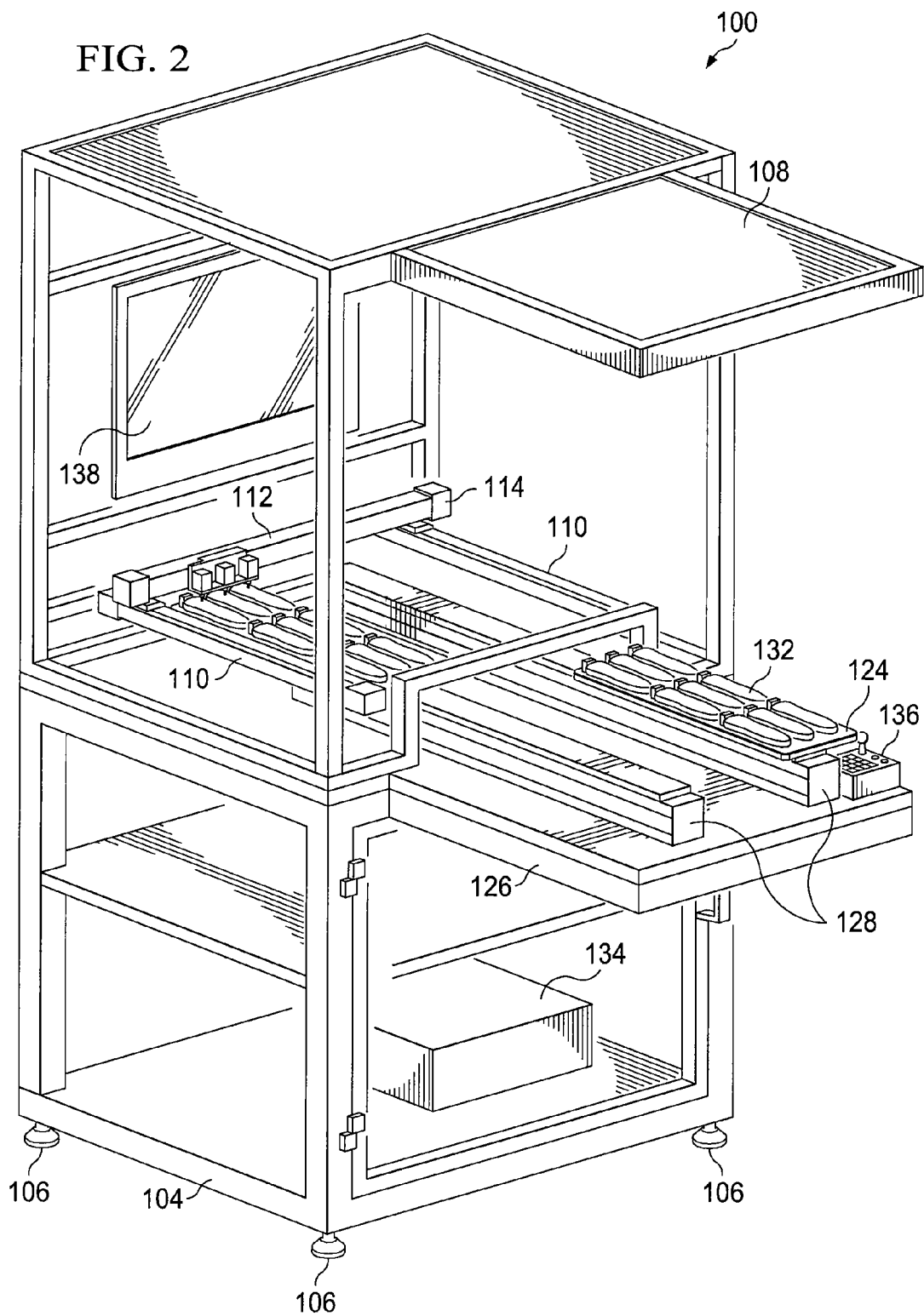
FIG. 2 is a pictorial representation of the remote control tester of FIG. 1 in accordance with illustrative embodiment.
Figure 3:
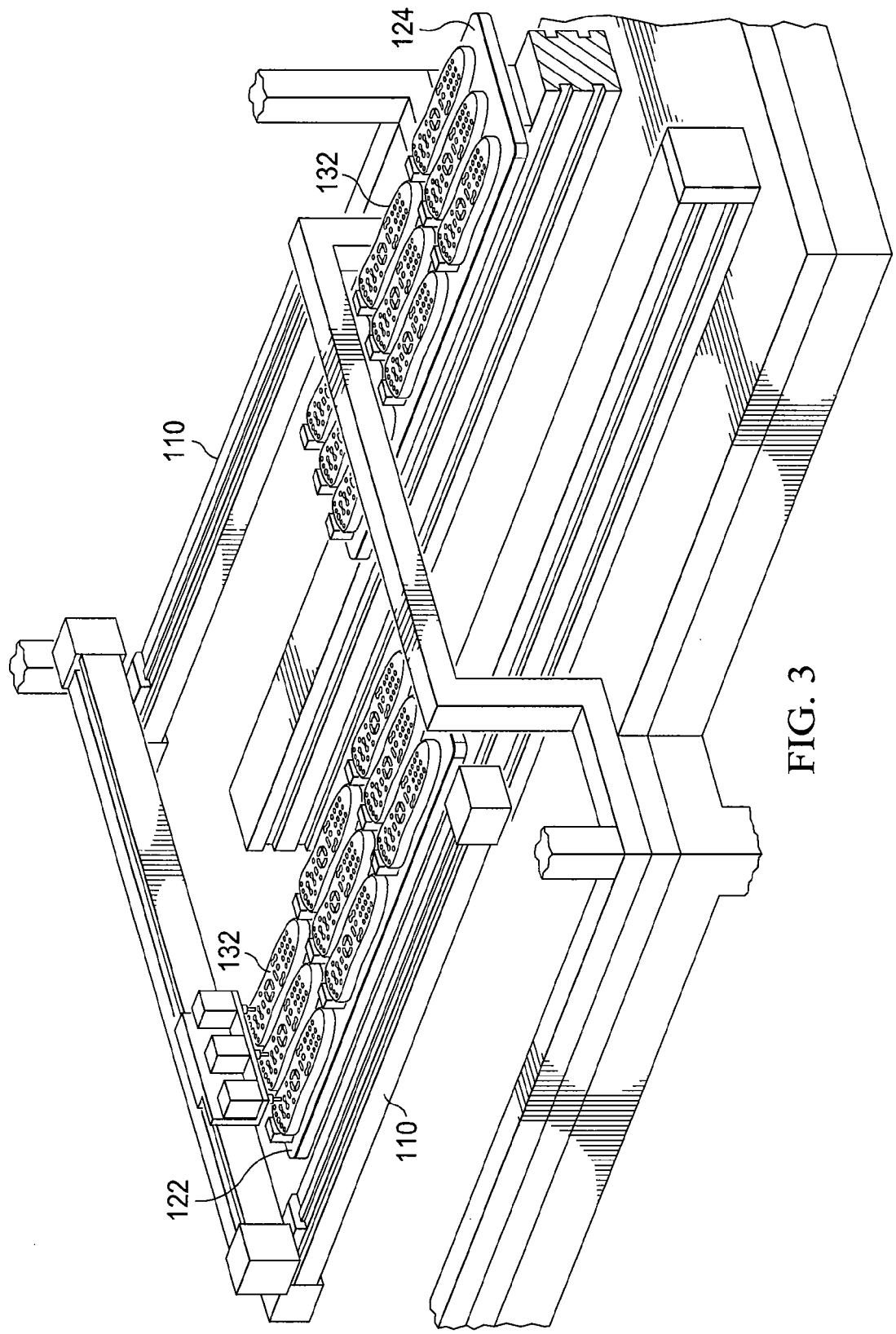
FIG. 3 is a pictorial representation of a portion of the remote control tester of FIG. 1 in accordance with an illustrative embodiment.

Illustrative embodiments provide a system, method, remote control tester, and devices for testing remote control devices. Remote control devices are any device utilized to control a separate device, system, or equipment. The illustrative embodiments may be utilized to test wireless remote controls that utilize any number of wireless spectra or frequencies. The remote controls being tested may also be referred to as units under test (UUT). However, the illustrative embodiments may also be utilized for directly or indirectly testing other electronic devices or wired remote controls. For example, the remote control tester pool may be utilized to test wireless devices, such as smart phones, that have fixed or soft buttons or interfaces.

In one embodiment, a remote control tester may be configured to test functionality or non-functionality of remote controls. One or more remote controls may be tested simultaneously. The remote control tester may be configured to test numerous makes and models of remote controls each of which may have a distinct configuration. For example, each of the remote controls may utilize different buttons, indicators, touch screen interfaces, or selection elements as well as distinct wireless signals. The remote control tester may include a memory or database or may access one or more memories, databases, or storage components to retrieve testing scripts, algorithms, programs, instructions, parameters, or other information for testing the specified remote controls. The remote control tester may receive wireless signals from the remote controls to determine whether the correct signal, command, or input is received based on a physical selection on the remote controls.

In one embodiment, the remote control tester may store the exact size, shape, position, and configuration of each remote control for providing physical input and otherwise interacting with the remote control. For example, the remote control tester may include multiple plungers each of which is utilized to physically interact with one of the remote controls under test. The remote control tester may store information indicating how far or to what pressure (e.g. load weight) the plungers apply for each portion of the test. The plunger locations and plunger depths may be programmed utilizing a location layout for the remote controls being tested. In another embodiment, the remote control tester may "learn" the correct positions in response to a user manually moving the different components, such as the actuators and moving the plunger to a desired depth. Each learned move may then be compiled to generate the testing program for reach of the tested buttons or other components.

The make and model of the remote control tester may be determined automatically or manually. In one embodiment, the remote control tester may include a scanner configured to scan an identifier, such as a barcode, serial number, or other identifying information associated with each of the remote controls. In another embodiment, the remote control tester may include a user interface that allows the user to select the remote controls under test. For example, the user interface may display pictorial or graphic representations of the remote controls to ensure that the proper testing parameters, scripts, and so forth are utilized by the remote control tester. The user interface may also allow a user to enter the identifier utilizing peripherals (e.g. keyboard, mouse, etc.), voice commands, tactile input, or so forth. For example, the remote control tester may include a touch screen for selecting the applicable remote controls, initiating one or more tests, presenting testing information, and displaying the test results.

The results of the testing may be displayed to the user by the remote control tester. In addition, a status of each of the remote controls as determined by the testing may be associated with the identifier included with or assigned to each of the remote controls. For example, broken or defective remote controls may be physically and electronically quarantined to prevent further utilization. As a result, the remote controls may be more easily processed without redistributing defective remote controls.

The remote control tester may be configured to secure numerous remote controls. In one embodiment, the remote controls may be secured within a platform. For example, each of the remote controls may be nested within the platform for proper alignment and consistency during testing. The platform may align each of the remote controls with a receiver configured to receive output from the remote control in response to a physical import or interaction with the test fixture. As a result, numerous remote controls may be tested simultaneously saving time and ensuring that testing is performed consistently.

In one embodiment, the remote control tester may temporarily power each of the remote controls during testing. For example, the remote control tester may include a power interface for simulating batteries or otherwise providing a power connection to the remote controls under test. The power interface may also facilitate the remote control tester in securing each of the remote controls for testing.

The remote controls that are tested may be received from communication service providers, individual users, retail providers, re-processors, or other individuals, groups, organizations, or companies. By testing each of the remote controls, defective remote controls may be fixed or properly disposed of. For example, defective remote controls may be recycled and fully functional remote controls may be redistributed for utilization.

Referring now to FIGS. 1-4 illustrating a remote control tester 100. In one embodiment, the remote control tester 100 is configured to be utilized by one or more users or operators, such as a user 102. The remote control tester 100 may be utilized as a standalone or networked device. As a result, the testing information and results may be stored locally or remotely based on the needs of the involved parties.

In one embodiment, the remote control tester 100 may include a frame 104, feet 106, a projector 108, vertical guides 110, a horizontal guide 112, motors 114 and 116, actuators 118, plungers 120, trays 122 and 124, a fixed platform 126, slides 128, sensors 130, remote controls 132, a controller 134, an interface 136 and a monitor 138. The frame 104 is the support structure of the remote control tester 100.

In another embodiment, the frame 104 is formed of metal, wood, polymers, plastics, or so forth. The frame 104 may include any number of shelves, cabinets, slotted walls, or so forth for customizing the remote control tester 100 for individual applications. The frame 104 provides support during testing and motion of various components of the remote control tester 100.

The feet 106 support the frame 104 and may be configured to be automatically balancing or self-leveling. In another embodiment, the feet 106 may be adjusted manually.

The remote control tester 100 is configured to receive multiple sets or batches of remote controls 132 for testing at a time. In one embodiment, a set may include nine remote controls. However, a set may be as large 12-100 remote controls. The remote control tester 100 may test multiple remote control units simultaneously at one time. For example, a set of three remote controls may be tested at a time.

In one embodiment, the user 102 may load a first tray 124 while a second tray 122 is being tested. The trays 122 and 124 may be configured to move, slide, or roll between a loading position shown by the tray 124 and a testing position shown by the tray 122. The trays 122 and 124 may be movably attached to the slides 128. The trays may move between the loading position and the testing position by moving along the slides 128. As a result, the trays 122 and 124 may be moved between the different positions. The tray may also be referred to a platforms, slots, carriers, cradles, or so forth. In one embodiment, once the user loads the remote controls, the user may select a push button (not shown). For example, the push button may be integrated with the interface 136. In another embodiment, the user may select a control component from the graphical user interface. In one embodiment, the trays 122 and 124 are connected by attached cylinders with threads inside for moving along a worm screw (not shown) or the slides 128. In one embodiment, the trays 122 and 124 and slides 128 may include any number of motors, conveyors, belts, bearings, roller-wheels, or so forth for moving the trays 122 and 124 between positions.

The user 102 may be protected from the motion of the components of the remote control tester 100 by the frame 104 which may include safety components including see-through and flexible barriers, such as plexiglass, hardened plastics, tempered glass, or so forth. The frame 104 may also include stops for preventing overextension or improper motion of the components of the remote control tester 100 during operation.

The fixed platform 126 is an extension of the frame 104. The fixed platform 126 may be connected to or support the slides 128 and each of the trays 122 and 124. The fixed platform 126 may also secure the interface 136.

The controller 134 is a computing device configured to control the operation of the remote control tester 100 and the testing of the remote controls 132 in response to user input. The controller 134 may be electrically connected to the interface 136, monitor 138, sensors 130, motors 114 and 116, actuators 118, and plungers 120. The controller 134 may be connected utilizing a wired connections, such as coaxial cables, twisted pairs, wires, buses, Ethernet cables, or so forth. In another embodiment, the controller 134 may wirelessly communicate with any of the components of the remote control tester 100. The controller 134 may also include a communications interface (not shown) for communicating with any number of networks or external devices, systems, equipment, databases, servers, or so forth. The communications interface may be an ethernet adapter, wireless card, LAN interface, or so forth. For example, the controller 134 may communicate the results of testing associated with each of the remote controls 132 to an external database for record-keeping and subsequent access. For example, a communications service provider may utilize the external database to determine failure rates for the remote controls 132

In one embodiment, the controller 134 is a standard computing device, such as a desktop computer or server. The controller 134 may include an application, commands, or set of instructions for performing the testing as is herein described. In another embodiment, the controller 134 is a specialized device including hardware and software configured to communicate with the electrical components of the remote control tester 100.

The user 102 interacts with and controls the remote control tester 100 utilizing the interface 136. The user interface 136 may include any number of peripherals, such as a mouse, keyboard, number pad, arrow keys, track ball, touch screen, scroll wheels, or dedicated buttons. The interface 136 may be utilized to initiate, manage, and testing of the remote controls 132 as may be necessary. The interface 136 may include controls for advancing and retracting the trays 122 and 124. The interface 136 may also include controls, such as a start button, for initiating testing of the remote controls 132 associated with either of the trays 122 and 124. In one embodiment, the interface 136 includes an emergency stop button for stopping the testing for any number of circumstances, such as a broken component, dislodged remote control, user danger, overload, or so forth.

The user interface 136 may further include a scanner (not shown) configured to scan an identifier associated with each of the remote controls 132. For example, the scanner may read a barcode, serial number, RFID tag, or other information associated with each of the remote controls. The trays 122 and 124 may further include an identifier, such as a barcode, for associating each of the remote controls with a test position of the trays 122 and 124. As a result, the relative positioning of each of the remote controls 132 may be recorded as well as the individual test results.

The status and feedback of the remote control tester 100 may be displayed to the user 102 through the monitor 138. The monitor 138 may be a flat screen, projector, holographic display, or other display component. In another embodiment, the remote control tester 100 may communicate within external display device, such as a laptop, tablet, or television screen. In one embodiment, the monitor 138 may display the results of a graphical user interface that is part of a testing application executed by the controller 134. For example, the monitor 138 may display the status and position of each of the trays 122 and 124, whether each position in the trays 122 and 124 are loaded with remote controls 132, the status of the testing process on the remote controls 132, and the results of the testing. For example, the monitor may display pass/fail information for each of the trays 122 and 124, overall pass/fail information, buttons of each of the remote controls 132 that passed or failed, tests completed per shift, day, or ever, current value rate, average failure rate, top detected failures (e.g. top 5 failures of remote controls 132), test timer per tray, shift time remaining, and date and time.

The projector 108 may also display testing results directly onto the trays 122 and 124. In one embodiment, the projector 108 is a light curtain that displays graphics, text, numbers, or other information onto the trays 122 and 124. The remote control tester 100 may also utilize the light curtain to provide safety for the user. For example, if the user's hand, tool, or other component is detected by the light current all testing is stopped.

For example, when the tray 124 is in the loading position, the projector 108 may indicate whether each of the remote controls 132 pass the testing performed by the remote control tester 100. The projector 108 may ensure that failed remote controls are processed specifically. For example, the projector 108 may display a red X onto any of the remote controls that failed the testing so that the user 102 may physically or electrically mark the failed remote controls for disposal, recycling, or repair. Similarly, the projector 108 may indicate if any of the remote controls 132 are not properly loaded or connected to the power source of the remote control tester 100 before testing is implemented.

The trays 122 and 124 may include or define multiple receptacles, slots, or nests for receiving the remote controls 132. In one embodiment, the trays may include multiple components as are subsequently described for customization to test different makes and models of remote controls 132. In one embodiment, the trays 122 and 124 may be composed of multiple nests that are grouped together and connected to a base plate (not shown) to perform the testing of the remote controls 132. In one embodiment, each nest may be configured to secure one of the remote controls 132. The nest may include a power interface for powering each of the remote controls 132 during testing. For example, prior to testing, the user 102 may remove a battery cover and any batteries from the remote controls 132 so that the remote control tester 100 may power each of the remote controls 132 during testing to ensure an operating power supply is provided and consistent. In another embodiment, the power interface may include a jack or plug for interfacing with each of the remote controls 132.

The motors 114 and 116, horizontal guide 112, vertical guides 110, actuators 118, and plungers 120 are configured to perform the physical testing of the remote controls 132. In one embodiment, the motors 114 and 116 are step motors that are connected to or integrated with the vertical guides 110 and the horizontal guide 112. The motors 114 and 116 may make a precise number of step revolutions to move the actuators 118 and plungers 122 one of a number of testing positions. For example, the motors 114 and 116 may include belts, chains, rollers, or grooves utilized to move along the vertical guides 110 and the horizontal guide 112. The motors 114 116 may be accurate to less than 1 mm in error.

The motors 114 and 116 are configured to position the actuators 118 and corresponding plungers 120 of the one or more of the remote controls 132 for testing. The testing area within the remote control tester 100 may be defined in terms of XY coordinates. Each button or interface of each of the remote controls 132 may have an associated XY coordinate. The coordinates are utilized to drive the motors 114 and 116 along the vertical guides 110 and the horizontal guide 112.

In one embodiment, the remote control tester 100 may include a visualization system for determining the XY coordinates necessary for performing testing of the remote controls 132. For example, a top portion of the remote control may include a camera for scanning, viewing, and otherwise visualizing the testing area.

Figure 4:
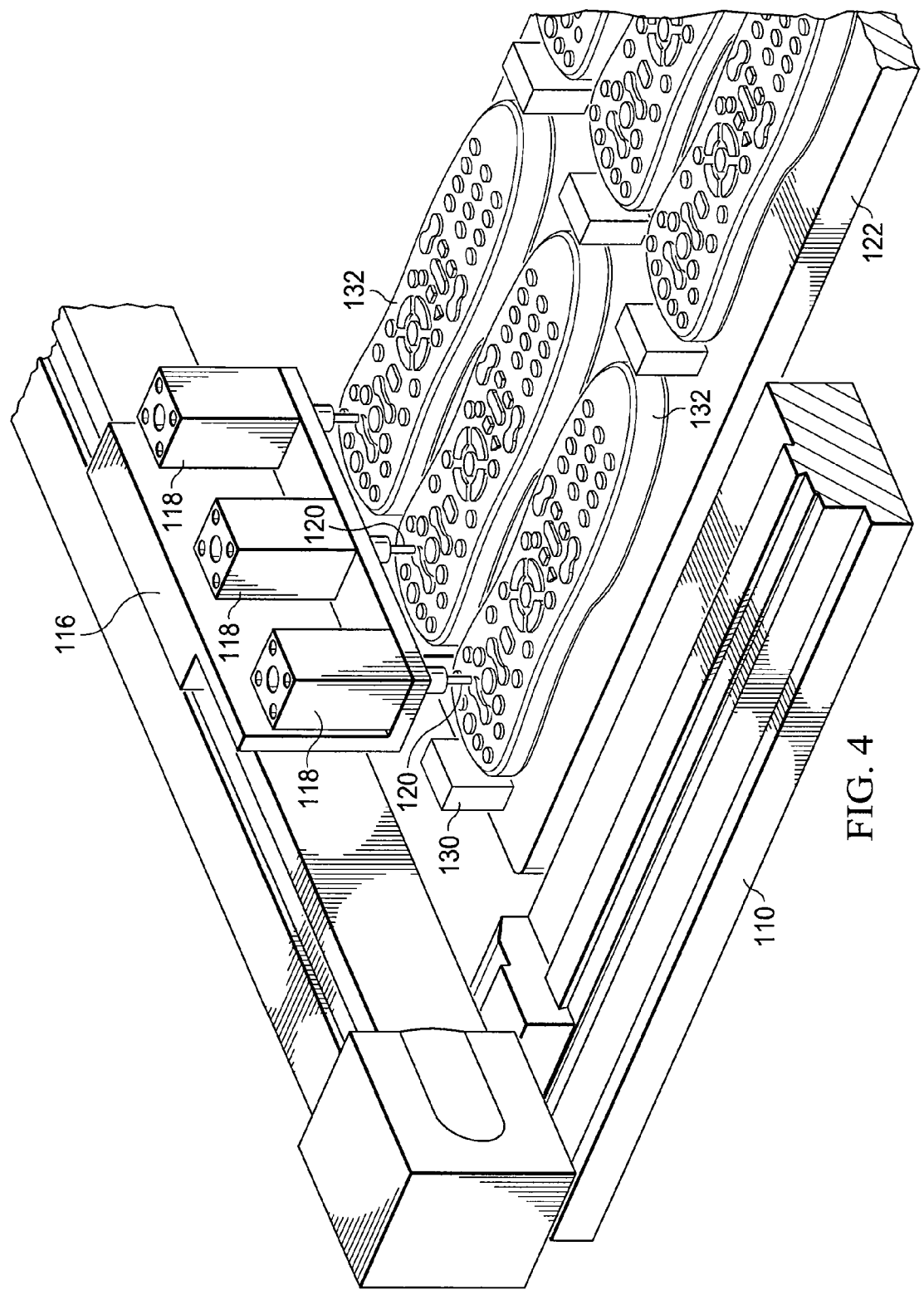
FIG. 4 is a pictorial representation of a portion of the remote control tester of FIG. 1 in accordance with an illustrative embodiment.

Once the actuators 118 are properly aligned above one or more of the remote controls 132, the actuators drive the plungers 120 a prescribed distance in the Z direction to the press buttons of the remote controls 132 (see FIG. 4). The size and shape of the buttons or interface components of the remote controls 132 may vary. As a result, the testing application utilized by the controller 134 may store a Z position that must be reached by each of the plungers 122 properly depress the corresponding buttons. In one embodiment, the plungers 120 are configured to press the same buttons across three of the remote controls 132 simultaneously. The remote control tester 100 may thereby test the remote controls 132 much more quickly than would be possible if testing only one remote control at once. The plungers 120 may be configured to be depressed for a specified time according to the testing program. For example, each button may be depressed for 2 seconds before moving on to the next button. The plungers 120 may also include an applied pressure specified by the testing program.

The sensors 130 or wireless receivers are configured to receive the output of each of the remote controls 132. For example, the sensors 130 may be configured to receive infrared commands received from the remote controls in response to the plungers 120 activating a portion of the remote controls 132. The controller 134 may associate the wireless output of each of the remote controls 132 with the buttons depressed by the plungers 122 ensure proper operation of the remote controls 132. For example, when a power button of the remote controls 132 is selected, the remote controls 132 should output a wireless signal to power on an associated electronic device. In one embodiment, the controller 134 stores the information, data, and signals received from the sensors 130 and associated with each of the remote controls 132 in a database. Errors or incorrect outputs are associated with each of the corresponding remote controls 132 and stored in the controller 134.

In another embodiment, the remote control tester 100 may only include one sensor or receiver. The receiver may receive feedback from each of the remote controls sequentially, concurrently, or simultaneously. For example, with Bluetooth remote controls, the plungers 120 may be activated by the actuators 118 sequentially, such that the sensor/transceiver may receive the corresponding output and communicate the output to the controller 134. This embodiment may be particularly useful for wireless signals, such as Bluetooth or Wi-Fi, that are not line of sight or directional, such as infrared remote controls.

The components of the remote control tester 100 may be configured to mechanically and electrically test the remote controls 132. The testing may be performed extremely quickly and efficiently utilizing the automated system and programming of the remote control tester 100. As a result, numerous remote controls 132 may be simultaneously loaded and tested utilizing speed and accuracy to ensure consistent results. For example, the remote controls 132 may be received from a manufacturer, communication service provider, or refurbishing group for testing before being distributed for utilization by any number of individuals, group, or organizational users.

Figure 5:
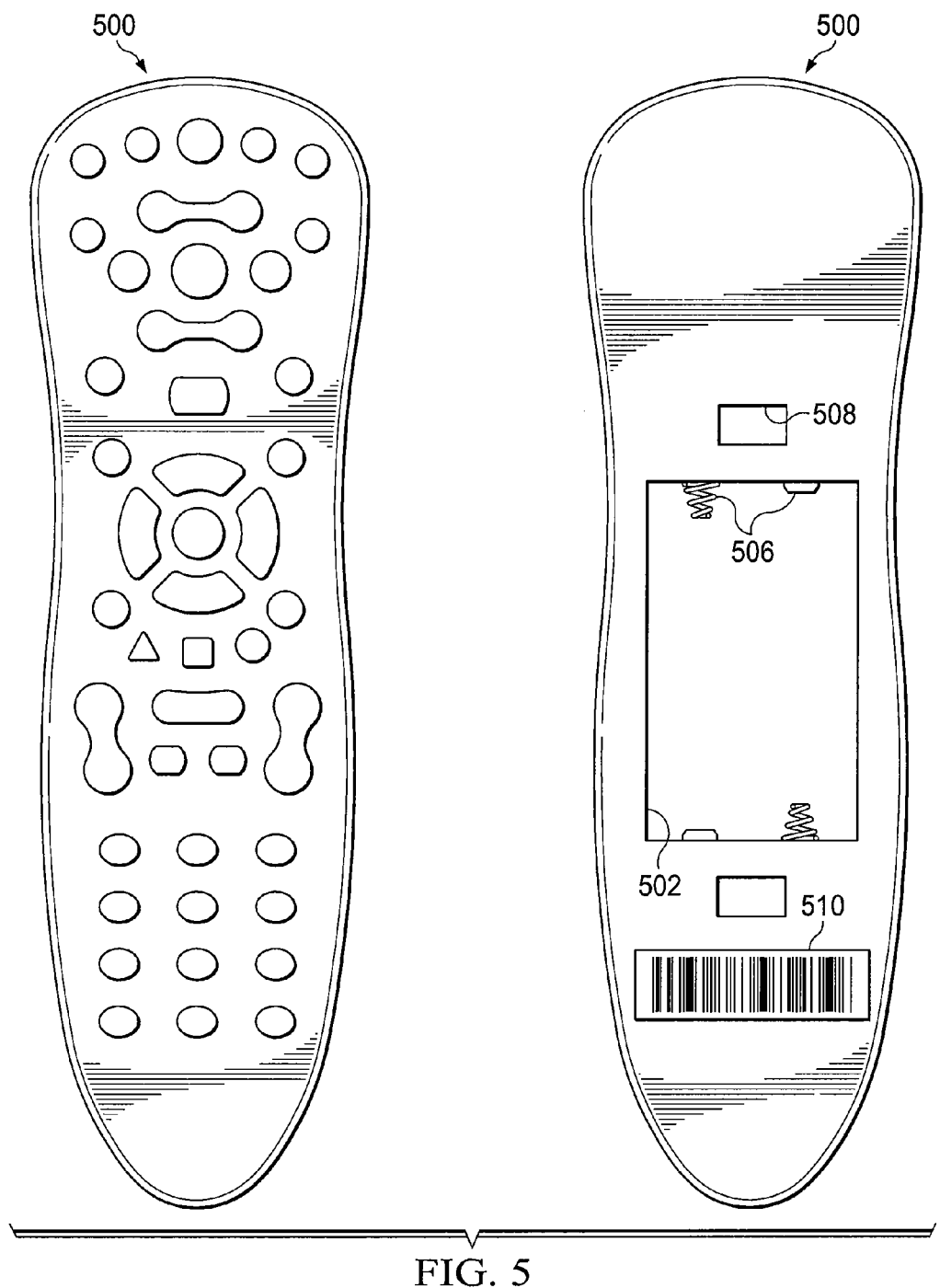
FIG. 5 is a pictorial representation of a front view and a back view of a remote control in accordance with an illustrative embodiment.

FIG. 5 is a pictorial representation of a front view and a back view of a remote control 500 in accordance with an illustrative embodiment. The remote control 500 is one example of a remote control, such as the remote controls 132 of FIG. 1. The remote control 500 may include any number of buttons, scroll wheels, touch interfaces, accelerometers, or selection components for receiving user input. The remote control 500 may utilize infrared, Bluetooth, or other wireless signals to control one or more electronic devices, such as a set-top box, television, DVR, streaming device, sound system, media system, or so forth.

The remote control tester may be configured to test each and every button of the remote control 500, the most frequently used buttons, a random assortment of buttons, or any combination thereof.

FIG. 5 further illustrates the remote control 500 with a battery cover removed to expose a battery cavity 502. A power interface of the remote control tester may be inserted within the battery cavity 502 to power the remote control 500 during testing. The remote control 500 may also include slots 508 that may be utilized to lock or secure the remote control tester 500 in place. For example, locking mechanisms may be inserted within the slots 508 to hold and stabilize the remote control 500 during testing.

The remote control 500 may also include electrical contacts 506 that are utilized to power the remote control 500. The electrical contacts 506 may be spring-loaded or biased for remaining in contact with positive and negative ends of batteries inserted within the remote control 500.

The remote control 500 may also include an identifier 510. In one embodiment, the identifier 510 is a barcode that may be read by a scanner of the remote control tester. The identifier 510 may also be a serial number, RFID tag, QR code, label, or other identifier.

Figure 6:
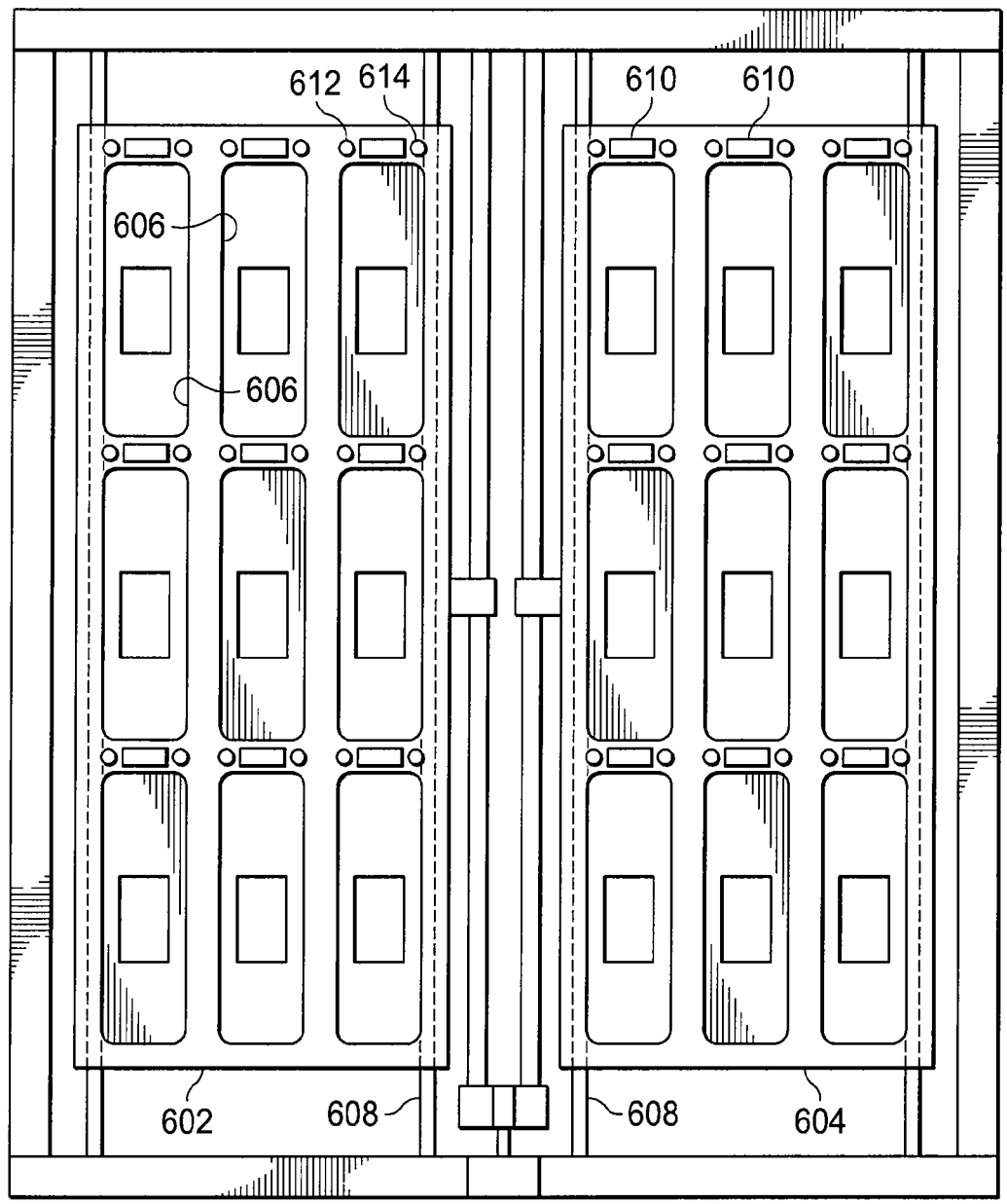
FIG. 6 is a pictorial representation of trays for a remote control tester in accordance with an illustrative embodiment.

FIG. 6 is a pictorial representation of trays 602 and 604 of a remote control tester in accordance with an illustrative embodiment. In one embodiment, the trays 602 and 604 include receptacles 606 configured to receive remote controls (not shown). In one embodiment, the trays 602 and 604 may be formed or molded from a single piece of plastic. In another embodiment, the trays 602 and 604 may be composed of individual nests associated with each of the receptacles 606 that are connected to a base plate (not shown).

As previously described, the trays 602 and 604 may be movably connected to one or more rails, such as rails 608. In one embodiment, the rails 608 are metal supports guides. For example, the trays 602 and 604 may include wheels, rims, rollers, or bearings that allow movement back and forth along the rails 608. The embodiment shown in FIG. 6 includes two rails 608 for each side of the trays 602 and 604. However, any number of rails or support structures may be utilized to advance and retract the trays 602 and 604.

The trays 602 and 604 may further include sensors 610 and LEDs 612 and 614. The sensors 610 may be configured to receive the wireless signals output by the remote controls during testing. These sensors 610 may align with the output ports of the associated remote controls to ensure that the signals may be properly detected and read. In one embodiment, the sensors 610 may be configured to be adjusted, moved, or positioned. For example, the height of the sensors 610 may be automatically (e.g. elevation motor) or manually adjusted based on the output port of the remote controls.

The LEDs 612 and 614 may be configured to display information to a user. In one embodiment, the LEDs 612 may indicate whether each of the remote controls failed the testing with a red light. The LEDs 612 may help ensure that remote controls that fail the testing are properly processed and not included with remote controls that passed the testing. Similarly, the LEDs 614 may indicate whether each of the remote controls past the testing utilizing a green light. The LEDs 614 may also be utilized to indicate whether each of the remote controls is properly connected to the trays 602 and 604 by displaying a white light when each of the trays is and the loading position. The LEDs 612 and 614 may further indicate connection or testing errors or other status information for each of the trays 602 and 604 as well as the remote control tester as a whole.

Figure 7:
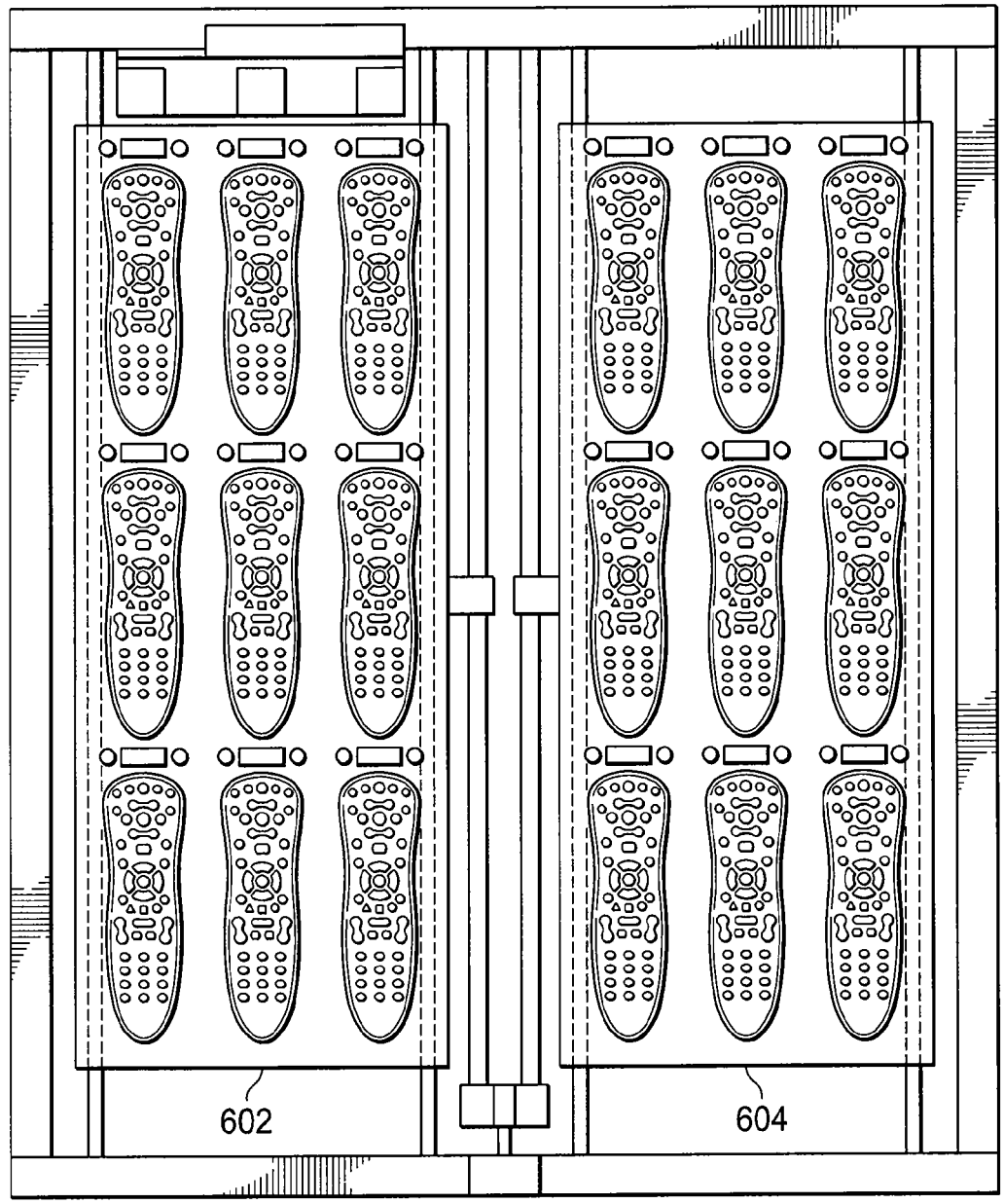
FIG. 7 is a pictorial representation of the trays of FIG. 6 loaded with remote controls in accordance with illustrative embodiment.

FIG. 7 is a pictorial representation of the trays 602 and 604 of FIG. 6 loaded with remote controls 616 in accordance with illustrative embodiment. The trays 602 and 604 may be configured for a make and model corresponding to the remote controls 616. The user may include a number of trays that may be utilized for a number of different makes and models of remote controls. As a result, the user may test the different makes and models without significant difficulty.

In one embodiment, each of the trays 602 and 604 may include an identifier that indicates the make and model of the remote controls 616 being tested. The identifier may be entered into the remote control tester or scanned to load the associated testing program, information, scripts, or commands. For example, the identifier may be associated with XY positioning for the plungers to test the required buttons.

Figure 8:
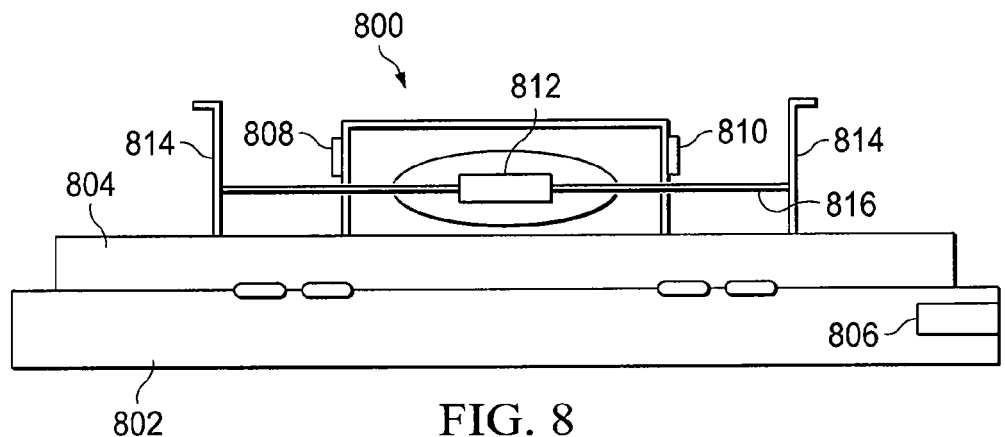
FIG. 8 is a side view of a power supply interface in accordance with an illustrative embodiment.

FIG. 8 is a side view of a power supply interface 800 in accordance with an illustrative embodiment. FIG. 8 illustrates a portion of the remote control tester. In one embodiment, the power supply interface 800 may be integrated with each of the trays as are previously described. The trays may include a base plate 802 and a nest 804. The base plate 802 and the nest 804 may further include or integrate a power connector 806. The power supply interface 800 may further include electrical contacts 808 and 810 and a lock 812.

The base plate 802 is the supporting structure for moving the remote controls under test back and forth between the loading position and the testing position. The base plate 802 may also be referred to as a moving plate. The nest 804 may be connected to or integrated with the base plate 802. The nest 804 may include one or more openings, carve-outs, depressions, or molded components for receiving one or more remote controls. For example, the nest 804 may be attached to the base plate 802 utilizing set screws. The nest 804 may also be attached to the base plate 802 utilizing clamps, tabs, Velcro, or other securing components. The nest 804 may be specially configured to receive a single remote control. In another embodiment, the nest 804 may be configured to receive a set of remote controls. For example, the nest 804 may be configured to receive nine remote controls at one time and may similarly include power supply interfaces for each of the nine remote controls.

In one embodiment, the base plate 802 and the nest 804 may make up a shuttle that is moved back and forth to perform testing of the remote controls or the tray as was previously described. The base plate 802 and the nest 804 may include the power connector 806. The power connector may be connected at one end (not shown) to a power supply of the remote control tester. The power supply may provide the required voltage and current for each of the remote controls. In one embodiment, the power supply may be varied for testing different makes and models of remote controls. Another end of the power connector 806 may be connected to the electrical contacts 808 and 810 to provide the current and voltage (e.g., a minimal DC voltage and current) typically provided by batteries, a battery pack, or so forth. For example, the power connector 806 may extend through the base plate 802 and the nest 804 to the electrical contacts 808 and 810. The power connector 806 may be insulated or shielded from contact with the base plate 802 and nest 804. In another embodiment, contacts between the different components of the power supply interface 800 may ensure that the electrical contacts 808 and 810 are energized.

In one embodiment, the electrical contacts 808 and 810 are spring-loaded or biased to interface with contacts of the remote control. The electrical contacts 808 and 810 may also be moved or locked into position by the lock 812. In one embodiment, the lock 812 is a small handle that engages the electrical contacts 808 and 810 to secure the remote control. The lock 812 may also be connected to any number of non-slip members, arms, clamps, latches, or so forth that secure the remote control for testing. In another embodiment, the locking mechanism may be pneumatic and each of the remote controls may be held in place by suction. In addition, a robot interface or mechanical arms may be utilized to place and remove the remote controls.

The power supply interface 800 may also include arms 814 that may be configured to engage or secure a remote control during testing. The arms 814 may be connected to the lock 812 by a connector 816. The arms 814 may be engaged within slots of the remote control when positioned on or connected to the remote control tester. In another embodiment, the arms 814 may be configured to abut and or sides of the remote control to stabilize and secure the remote control during testing.

Figure 9:
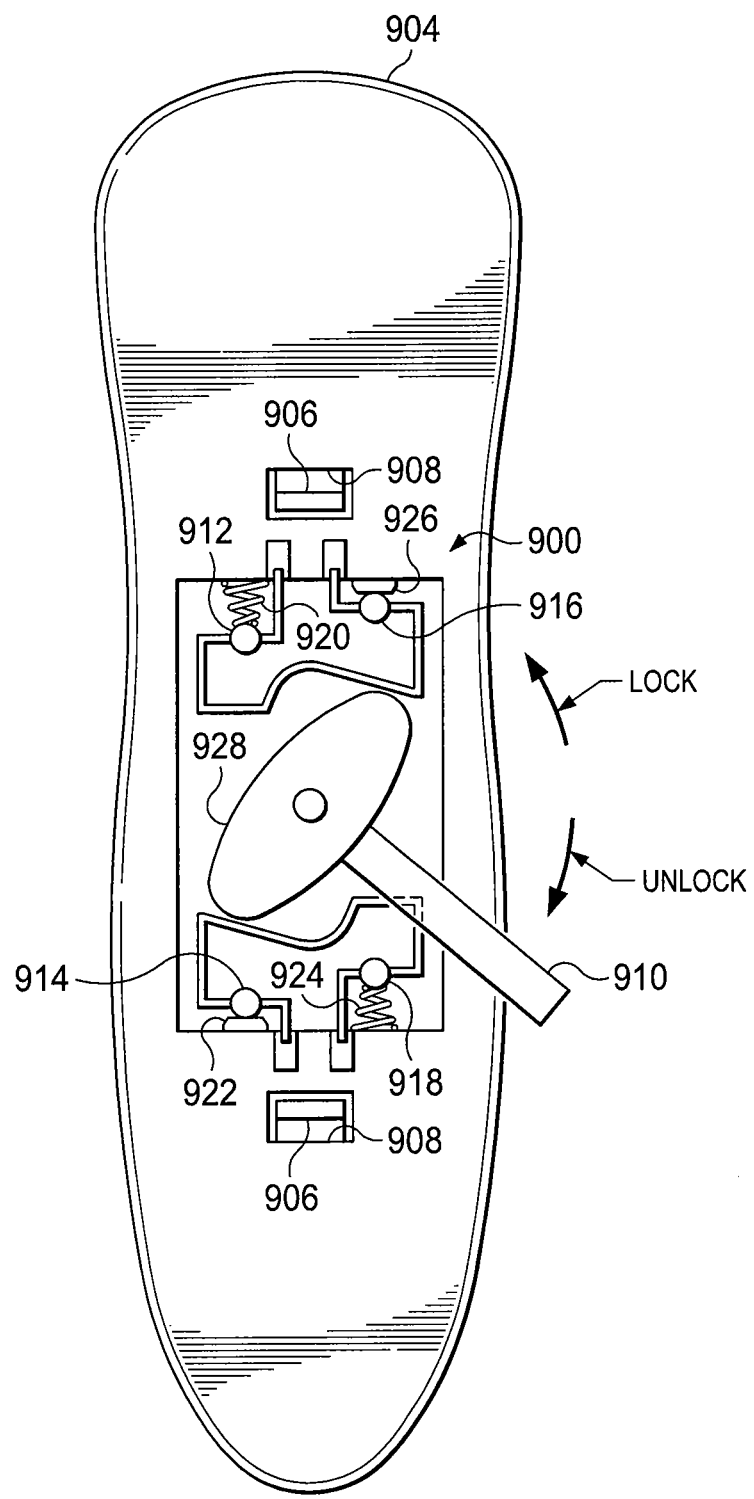
FIG. 9 is a rear view of a power supply interface connecting to a remote control 904 in accordance with an illustrative embodiment.

FIG. 9 is a rear view of a power supply interface 900 connecting to a remote control 904 in accordance with an illustrative embodiment. In one embodiment, the power supply interface 900 includes arms 906 for engaging the slots 908 of the remote control 904. The arms 906 may be L-shaped and may be configured to press against edges of the slots 908 when a locking handle 910 is engaged. As previously described, the power supply interface may include electrical contacts 912, 914, 916, and 918 that are configured to electrically engage corresponding electrical contacts 920, 922, 924, and 926 of the remote control 904.

In one embodiment, the electrical contacts 912, 914, 916, and 918 are flexible leads that are pushed, bend, or deformed into position by a driver 928 pivotally connected to the locking handle 910. For example, when the locking handle 910 is moved between a unlocked and lock position, the driver 928 may push against the electrical contacts 912, 914, 916, and 918 on each side of the power supply interface 900 to ensure a good connection to the electrical contacts 920, 922, 924, and 926 of the remote control 904.

In another embodiment, the contacts 912, 914, 916, and 918 may be spring-loaded and may be compressed when the locking handle 910 is unlocked or disengaged position. The contacts 912, 914, 916, and 918 may be extended when the locking handle 910 is moved to the locked or engaged position. The power supply interface 900 may utilize any number of configurations including spring loaded interfaces, lever controlled interfaces, or insertion blocks with power clips for engaging the electrical contacts 920-926 of the remote control 904.

Figure 10:
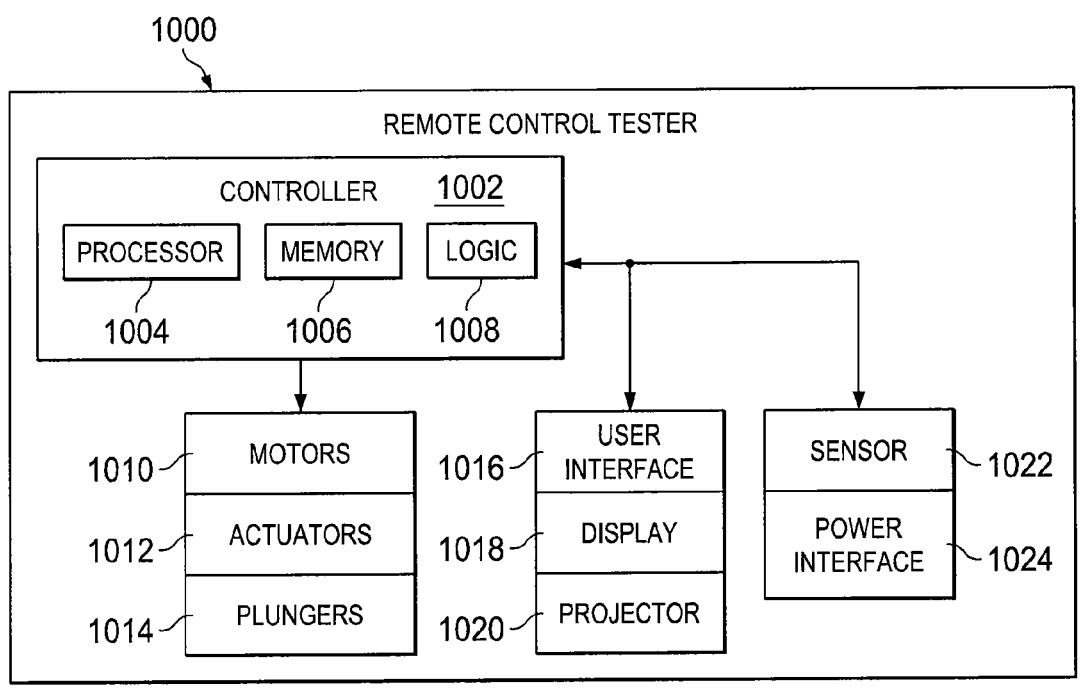
FIG. 10 is a block diagram of a remote control tester in accordance with an illustrative embodiment.

FIG. 10 is a block diagram of a remote control tester 1000 in accordance with an illustrative embodiment. In one embodiment, the remote control tester 1000 may include a controller 1002. The controller 1002 may include a processor 1004 a memory 1006 and logic 1008. The remote control tester 1000 may further include motors 1010, actuators 1012, plungers 1014, a user interface 1016, a display 1018, a projector 1020, sensors 1022, and a power interface 1024. The remote control tester 1000 may include any number of computing components, devices or elements which may include busses, motherboards, circuits, ports, interfaces, cards, converters, adapters, connections, transceivers, displays, antennas, and other similar components.

As previously described, the components of the remote control tester 1000 may be mounted within, connected to, or housed within a frame (not shown). The frame may provide structural support, stability, and protection to a user. In addition, the frame may include any number of shelves, brackets, cabinets, rails, or so forth for customization of the remote control tester 1000.

The processor 1004 is circuitry or logic enabled to control execution of a set of instructions. The processor 1004 may be microprocessors, digital signal processors, application-specific integrated circuits (ASIC), central processing units, or other devices suitable for controlling an electronic device including one or more hardware and software elements, executing software, instructions, programs, and applications, converting and processing signals and information, and performing other related tasks. The processor 1004 may be a single chip or integrated with other computing or communications elements.

The memory 1006 is a hardware element, device, or recording media configured to store data for subsequent retrieval or access at a later time. The memory 1006 may be static or dynamic memory. The memory 1006 may include a hard disk, random access memory, cache, removable media drive, mass storage, or configuration suitable as storage for testing data, instructions, user profiles, make and model configurations, and information. The memory 1006 may include one or more databases for storing testing parameters, settings, test results, and so forth. In one embodiment, the memory 1006 and processor 1004 may be integrated. The memory may use any type of volatile or non-volatile storage techniques and mediums.

The logic 1008 may include dedicated digital logic or circuitry for controlling the functions performed by the controller 1002. For example, the logic 1008 may include one or more motherboards, application-specific integrated circuits (ASIC), field programmable gate arrays (FPGA), and other similar components. In another embodiment, the logic 1008 may represent the programs, applications, instructions, or commands utilized by the controller 1002 to control the other components of the remote control tester 1000.

The motors 1010 may be configured to position the testing components of the remote control tester 1000. For example, the motors 1010 may position the actuators 1012 and the associated plungers 1014 in order to depress buttons of the remote controls under test. Rollers, belts, pistons, chains, steps, or other mechanical components may be utilized to accurately drive the linkage is connected to the motors 1010.

The actuators 1012 may be configured to drive plungers 1014 to depress buttons of the remote controls. The actuators 1012 may be electrically, gas (e.g. air driven), hydraulic, or so forth. The motors 1010, actuators 1012, and plungers 1014 may be controlled by the controller 1002 to perform the testing corresponding to the make and model of the remote controls under test.

The user interface 1016 may be configured to receive input, commands, and feedback, from the user. As previously described, the user interface 1016 may include any number of externally connected peripherals, integrated buttons, safety switches or buttons, touch screens, dedicated buttons, or so forth. Hard keys are dedicated buttons or interface elements hard-coded for a single, unique, and consistent purpose. Examples of hard keys include an emergency stop button and a testing implementation button. In one embodiment, the user interface 1016 includes a touch screen. The touch screen may include soft keys. Soft keys are programmable buttons or interface elements. Soft keys are usually located alongside a display device and may perform different functions dependent on the text shown near the soft keys on the display. Examples of soft keys may include directories and speed dial lists.

The display 1018 may be utilized to display information and data to the user. For example, the display 1018 may be a monitor, television, or touch screen. Alternatively, the user interface 1016 and the display 1018 may be integrated. In one embodiment, the display 1018 may display a graphical user interface generated by the controller 1002. The graphical user interface may be configured to take the user/operator through each step of the testing process including at least loading the remote controls, testing the remote controls, and processing the remote controls based on the testing.

The projector 1020 may be utilized to display information on the remote control tester 1000 or on the remote controls under test. As previously described, the projector 1020 may represent one or more light curtains that display testing results on to the remote controls under test in real-time or in response to the testing being completed. The projector 1020 may also represent LEDs, bulbs, or other optical display components, devices, systems, or equipment.

The sensors 1022 may be configured to receive wireless signals from the remote controls under test. In another embodiment, where the remote controls are more sophisticated, the sensors 1022 may include a transceiver for both receiving information, data, and signals, as well as transmitting them to the remote controls to determine functionality. In one embodiment, the sensors may be interchangeable based on the type of the remote control being tested.

The power interface 1024 may be configured to provide power or an electrical signal allowing the remote controls under test to fully function. In one embodiment, the power interface 1024 may be integrated with the components of the trays. In another embodiment, the trays including a base plate, nest, and electrical or communications connections may be separately connected to distinct power interfaces that may be required for each make and model of remote controls. The positioning of the different components of the remote control tester 1000 including, but not limited to, the sensors and power interfaces may be reconfigured for each type of remote control being tested.

Figure 11:
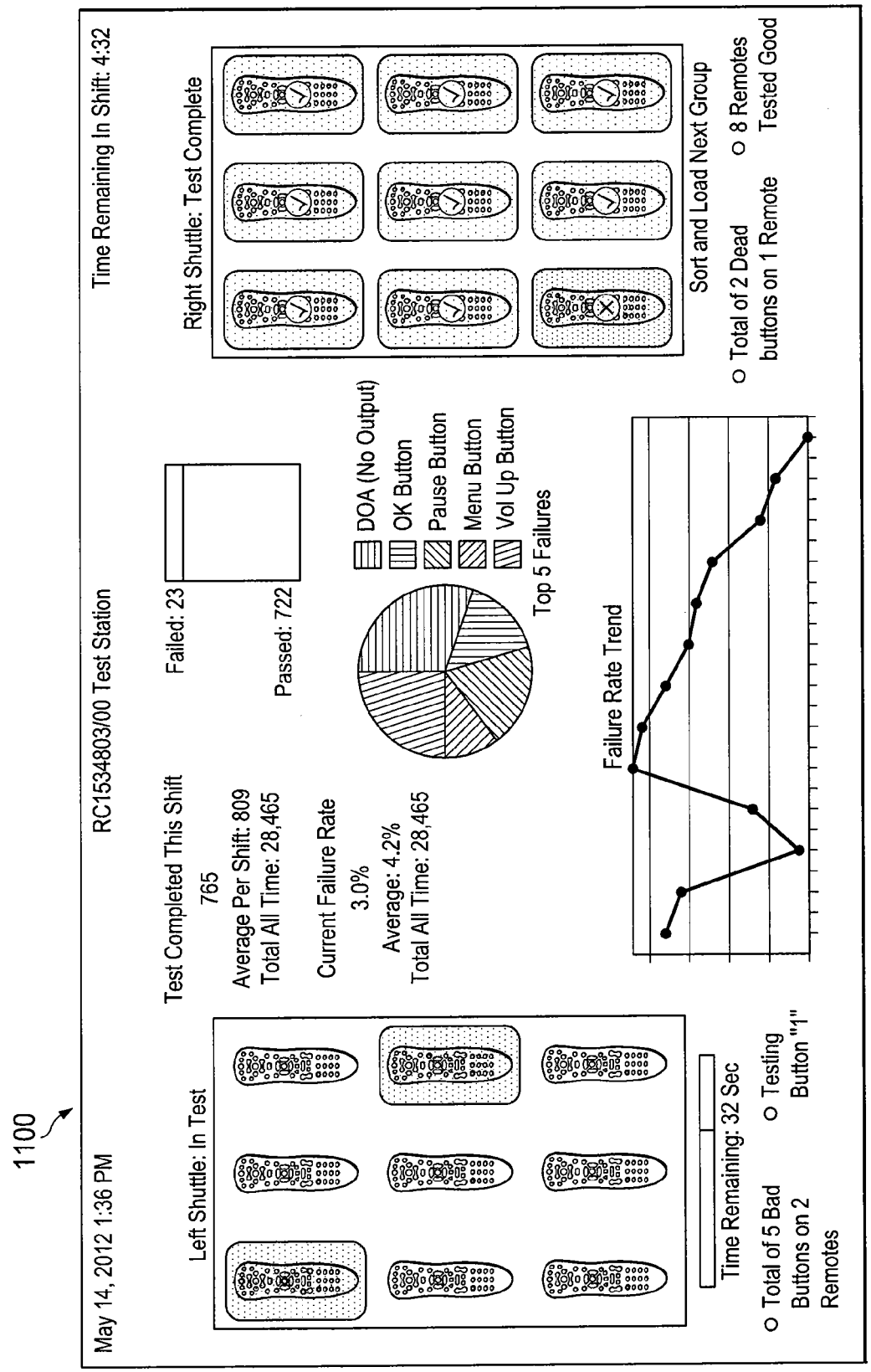
FIG. 11 is a pictorial representation of a graphical user interface of the remote control tester in accordance with an illustrative embodiment.

FIG. 11 is a pictorial representation of a graphical user interface 1100 of the remote control tester in accordance with an illustrative embodiment. In one embodiment, the graphical user interface 1100 may be displayed by a display of the remote control tester. In another embodiment, the graphical user interface 1100 may be displayed to a remote device communicating with the remote control tester to perform the testing. For example, a laptop, tablet, or other wireless device may communicate with the remote control tester to manage and perform the testing.

In one embodiment, the graphical user interface 1100 may show a date, time, test time, trays status, statistical results (e.g., pass and fail results and trends by a user, shift, lifetime of the remote control tester, day, week, month, year, etc.), identification of the remote control tester, operating user, testing information, and test results if known. The graphical user interface 1100 may show the status of each tray or shuttle. For example, the graphical user interface 1100 may indicate the remote controls being tested as well as individual buttons or selection elements being tested in real-time.

Figure 12:
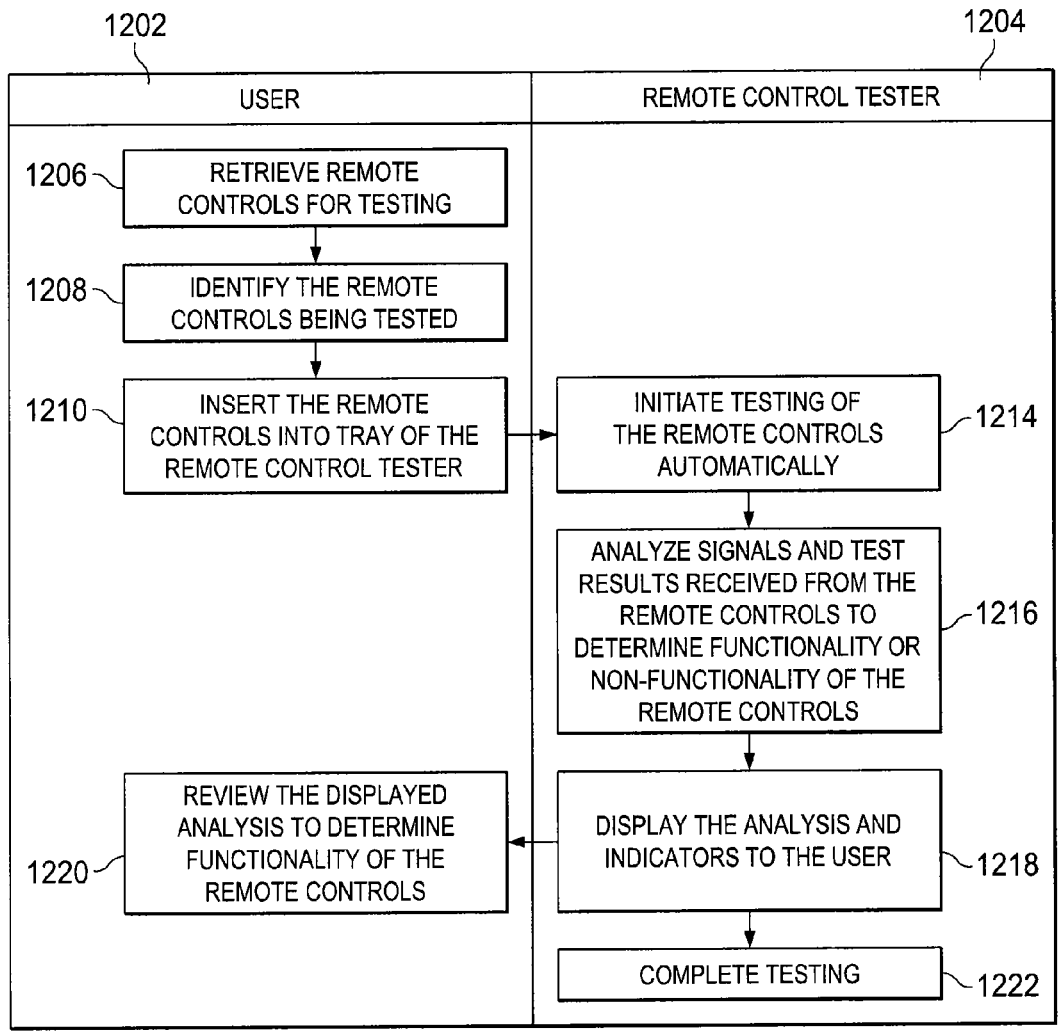
FIG. 12 is a flowchart of a process for testing remote controls in accordance with an illustrative embodiment.

FIG. 12 is a flowchart of a process for testing remote controls in accordance with an illustrative embodiment. The process of FIG. 12 may be implemented by a user 1202 and a remote control tester 1204 in accordance with one embodiment. The order of the steps in FIGS. 12 and 13 may be varied based on environment, conditions, and user preferences.

The process of FIG. 12 may begin with the user 1202 retrieving remote controls for testing (step 1206). The remote control may be tested as part of a returns, replacement, refurbishment, or repair process or other procedure that may require verification of the functionality of the set-top box. For example, the remote controls may be received in bulk shipments or as multiple devices.

Next, the user 1202 identifies the remote controls being tested (step 1208). In one embodiment, the user 1202 may scan a serial number, bar code, or other identifier of each of the remote controls utilizing a scanner integrated with or in communication with the remote control tester 1204. The user may also scan a slot number of the remote control tester for identifying the location and results of each of the remote controls.

Next, the user 1202 inserts the remote controls into the tray of the remote control tester 1204 (step 1210). During step 1210, the user 1202 may interface the remote control with the remote control tester 1204 by connecting the remote control with a battery interface of the remote control tester 1204. As a result, the remote control tester 1204 may power the remote controls during testing. The tray may include cavities or nests for passively receiving and securing each of the remote controls. Each of the remote controls may also be engaged or locked into place utilizing any number of securing arms or mechanisms. One or more trays may be extended from the remote control tester 604 utilizing motors linked with a user interface or a handle or other components to more easily access trays and insert or remove the remote controls. For example, a first tray may be moved to a testing position while a second tray is moved to a loading position.

Next, the remote control tester 1204 initiates testing of the remote controls automatically (step 1214). Step 1204 may also involve retesting the remote controls. The testing may be performed in response to the user 1202 scanning an identifier and the remote controls and slots of the trays. As previously described, the battery interfaces may be electrically connected to the remote control tester 1204 in order for the remote controls to be energized and subsequently tested. In one embodiment, each tray may be automatically tested in response to all of the slots being filled for the remote control tester 1204. In another embodiment, the user may initiate the testing for each of the remote controls. For example, the user may provide user input through a user interface, such as a command code to begin the process. If portions of the test fail, the user may be prompted to restart the test, rerun specific tests, run manual tests, or use a different process. The tests performed may be selected automatically or manually by a user. For example, a list of check boxes corresponding to tests may be selected by the user to initiate specific tests. The tests may include pressing or otherwise activating buttons or other components of the remote controls. For example, the remote control tester 1204 may utilize multiple plungers to test a number of remote controls simultaneously. For example, particular brands of remote controls may require a specified testing routine from an OEM or service provider to perform the required tests to certify functionality. Common tests may include individual button, power infrared, radio frequency, and other operational and functionality tests (e.g. play, stop, fast forward, number buttons, etc.).

Next, the remote control tester 1204 analyzes signals and tests results received from the remote controls to determine functionality or non-functionality of the remote control (step 1216). The testing instrumentation of the remote control tester 1204 may compare signals and results against command signals, expected frequencies, thresholds, ranges, parameters, or other expected results. For example, transceivers of the remote control tester 1204 may receive multiple wireless signals simultaneously. During step 1216 the remote control tester 1204 processes signals and data to determine whether the remote controls has passed a number of tests.

Next, the remote control tester 1204 displays the analysis and indicators to the user 1202 (step 1218). The analysis and indicators may be displayed in alphanumeric format or utilizing visual indicators, such as a user interface, green or red LEDs, or other displays to indicate that the remote control has passed or failed according to specified parameters stored by the remote control tester 12 for or utilized by the user 1202.

Simultaneously, the user 1202 reviews the displayed analysis to determine functionality of the remote control (step 1220). The user 1202 may provide additional feedback for user specific remote, or button tests to pass or fail each of the remote controls.

Next, the remote control tester 1204 completes testing (step 1222). In one embodiment, the remote control tester 1204 may save the test results locally or to an external device or database. The user 1202 may electronically or physically mark the remote controls that pass or fail for subsequent analysis. For example, a fail code may be associated with a serial number of a remote control that failed one or more of the tests run by the remote control tester 1204.

Figure 13:
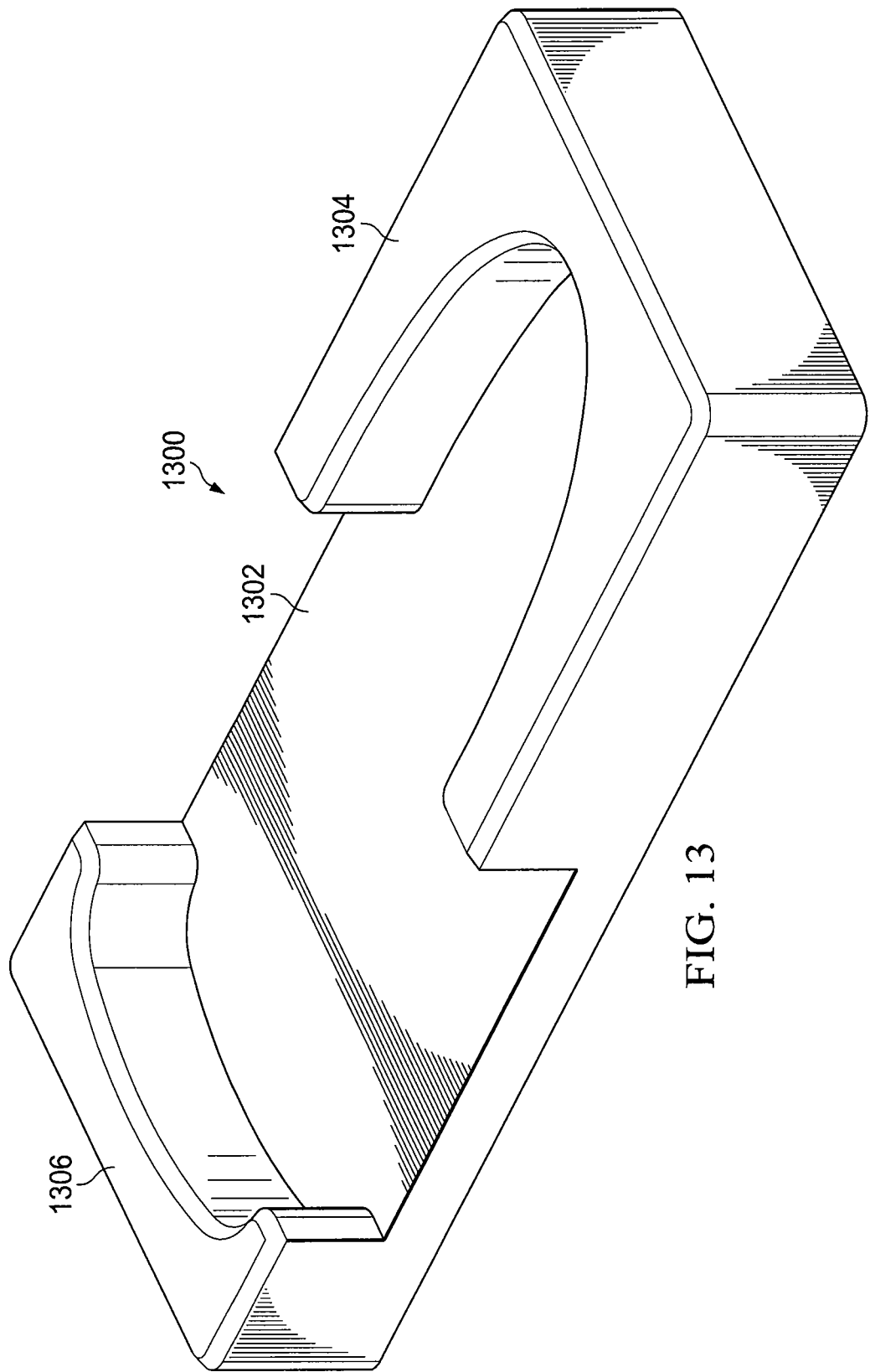
FIG. 13 is a pictorial representation of a remote control cradle in accordance with an illustrative embodiment.

FIG. 13 is a pictorial representation of a remote control cradle 1300 in accordance with an illustrative embodiment. In one embodiment, the remote control cradle 1300 may be integrated with or utilized with any of the remote control testers or test fixtures as are herein described. For example, one or more remote control cradles may be secured to the remote control tester for holding a number of remote controls. The remote control cradle 1300 may be connected to the remote control tester utilizing clamps, set screws, Velcro, or so forth. In one embodiment, the remote control cradle 1300 may be utilized with an optical system to determine whether each of the buttons of the remote control lights up, the remote control vibrates, or so forth in response to manual user input, or other mechanical stimuli.

In one embodiment, the remote control cradle 1300 may be sized to fit a particular make and model of remote control. For example, the remote control may be secured and nested within the remote control cradle 1300 during testing. In another embodiment, the remote control cradle 1300, including a base 1302 and side walls 1304, may be expanded or contracted (x, y, and z directions) to fit remote controls.

The base 1302 provides the support structure for the remote control cradle 1300 and prevents the remote control from moving or rocking during testing. The remote control cradle 1300 may include the side walls 1304 or supports for further securing and cushioning the remote control. The sidewalls 1304 may include any number of materials, structures, or liners, such as rubber, plastic, latex, knobs, protrusions, seals, or so forth for securing the remote control during testing.

The remote control cradle 1300 may include a shape and opening for providing an interference fit for the remote control. The remote control cradle 1300 may also include a front wall 1306 that may be sized and shaped to prevent signals, such as infrared signals, from being communicated. For example, in most remote controls the emitter or transceiver is positioned in a front portion of the remote control for communicating signals to one or more other devices. Blocking the signals may be important because multiple remote controls and devices may be tested simultaneously and as a result, the signals may interfere with other testing processes and results. In one embodiment, the front wall 1306 may include a lip for covering a portion of the front of the remote control during testing to further prevent signal leakage during testing and the remote control. The walls may also include one or more cutouts for removing sections or areas for utilization with the remote control tester The remote control cradle 1300 may also be utilized as a stand-alone device for manually testing button functionality. For example, a user may place a remote control in the remote control cradle 1300 and then the press buttons or activate other features of the remote control to determine functionality. The user may be watching to ensure that each button lights up as it is pressed by the user. The remote control cradle 1304 remote control tester may also include a vision system for ensuring that each of the buttons lights up when depressed. In another embodiment, the remote control cradle 1300 may have any of the features of the remote control tester integrated in a single unit designed for rapid testing of individual remote controls. For example, the remote control cradle 1300 may include a processing system, a user interface (e.g. selecting a make and model of remote control, implementing testing, viewing results, and so forth), a transceiver in the front wall 1306, and motion driven actuator for testing buttons in rapid succession, and so forth as are herein described.

The previous detailed description is of a small number of embodiments for implementing the invention and is not intended to be limiting in scope. The following claims set forth a number of the embodiments of the invention disclosed with greater particularity.

What is claimed:

1. A remote control tester comprising:
   a frame configured to support components of the remote control tester;
   one or more trays configured to secure a plurality of remote controls for testing, wherein the one or more trays include a power interface for powering each of the plurality of remote controls during testing;
   one or more motors configured to move a set of actuators including a set of plungers, wherein the set of plungers press corresponding buttons of a set of the plurality of remote controls simultaneously;
   a controller for controlling the one or more motors and the set of actuators in response to a test program associated with the plurality of remote controls;
   a user interface connected to the controller for receiving user input;
   one or more transceivers connected to the controller for receiving wireless signals from the plurality of remote controls during testing; and
   a display for displaying testing information for the plurality of remote controls to a user.

2. The system according to claim 1, wherein the frame includes a partition for protecting the user from injury during testing.

3. The system according to claim 1, wherein the test program is associated with a make and model of the plurality of remote controls.

4. The system according to claim 1, wherein the one or more trays include at least two trays that are moved between a loading position accessible to the user and a testing position.

5. The system according to claim 1, wherein the test program is automatically implemented in response to the plurality of remote controls.

* * * * *